(12) United States Patent
Chen

(10) Patent No.: US 7,091,617 B2
(45) Date of Patent: Aug. 15, 2006

(54) DESIGN AND LAYOUT TECHNIQUES FOR LOW PARASITIC CAPACITANCE IN ANALOG CIRCUIT APPLICATIONS

(75) Inventor: Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/084,784

(22) Filed: Mar. 21, 2005

(65) Prior Publication Data
US 2006/0087003 A1    Apr. 27, 2006

Related U.S. Application Data

(60) Provisional application No. 60/620,966, filed on Oct. 22, 2004.

(51) Int. Cl.
*H01L 29/76* (2006.01)
(52) U.S. Cl. ............... 257/773; 257/734; 257/E23.144
(58) Field of Classification Search ............... 257/595, 257/596, 597, 598, 599, 600, 601, 602, 503, 257/545, 550, 490, 495
See application file for complete search history.

(56) References Cited

U.S. PATENT DOCUMENTS 5,027,174 A * 6/1991 Mimoto

OTHER PUBLICATIONS

Wolf,"Silicon Processing for the VLSI Era, vol. 3—The Submicron MOSFET," 1995, Lattice Press, vol. 3, p. 323-324.*

* cited by examiner

*Primary Examiner*—Nathan J. Flynn
*Assistant Examiner*—Kevin Quinto
(74) *Attorney, Agent, or Firm*—Sterne, Kessler, Goldstein & Fox P.L.L.C.

(57) ABSTRACT

A semiconductor device that reduces the parasitic capacitance between a conductive trace and a substrate, and a method of fabricating the same. The semiconductor device includes a substrate, an insulator layer disposed upon the substrate, a conductive trace disposed upon the insulator layer, and an element disposed between the substrate and the conductive trace. A first capacitance exists between the conductive trace and the substrate and a second capacitance results between the conductive trace and the substrate due to the presence of the element. The second capacitance is in series with the first capacitance, thereby reducing an effective capacitance between the conductive trace and the substrate.

10 Claims, 5 Drawing Sheets

DESIGN AND LAYOUT TECHNIQUES FOR LOW PARASITIC CAPACITANCE IN ANALOG CIRCUIT APPLICATIONS

CROSS REFERENCE TO RELATED APPLICATIONS

This application claims the benefit of U.S. Provisional Patent Application No. 60/620,966 to Chen, entitled "Design and Layout Techniques for Low Parasitic Capacitance in Analog Circuit Application" and filed Oct. 22, 2004, the entirety of which is incorporated by reference as if fully set forth herein.

BACKGROUND OF THE INVENTION

1. Field of the Invention

The present invention is related to semiconductor devices and integrated circuits. More specifically, the present invention relates to Very Large Scale Integration (VLSI) systems.

2. Background Art

In VLSI applications the parasitic capacitance of the signal lines to the substrate reduces the signal bandwidth and signal speed due to the filtering effect. The parasitic capacitance arises from an electrical coupling between the signal line and the substrate. The equation for the parasitic capacitance is given by:

$$C = eA/d, \qquad \text{Eq. 1}$$

where e is the dielectric constant of an insulator disposed between the signal lines and the substrate, d is the spacing between the signal lines and the substrate, and A is the area of the signal lines. The signal width times the signal length is the area of the signal lines. If, for example, the insulator is a field oxide, the dielectric constant, e, is about 3.9 and the thickness of the field oxide insulator, d, is about 0.3 μm.

The above equation suggests that the parasitic capacitance can be reduced by adjusting the parameters that appear on the right side of the equal symbol (e.g., e, A and d). For example, reducing the area, A, reduces the parasitic capacitance, but at the cost of proportionally increasing the parasitic resistance, which in turn decreases the signal speed. For a given VLSI process, adjusting the thickness, d, and the dielectric constant, e, is not a viable option. This is because for a fixed VLSI fabrication process, such as a standard complementary metal oxide semiconductor (CMOS) process, the thickness and dielectric constant of the insulator disposed between the signal lines and substrate remain constant. Accordingly, it is difficult to reduce the parasitic capacitance without changing the process material or flow.

Therefore, what is needed is a device and method that reduces the parasitic capacitance without changing the process material or flow.

BRIEF SUMMARY OF THE INVENTION

The present invention meets the above-identified needs by providing a device and method for reducing the parasitic capacitance without changing the process material or flow.

An embodiment of the present invention provides a device, comprising a substrate, an insulator layer disposed upon the substrate, and a conductive trace disposed upon the insulator layer, wherein a first capacitance exists between the conductive trace and the substrate. According to the present invention, an element is disposed between the substrate and the conductive trace, wherein the additional element produces a second capacitance between the conductive trace and the substrate, such that the second capacitance is in series with the first capacitance. As a result, this second capacitance causes the effective capacitance between the conductive trace and the substrate to be reduced, because it is in series with the parasitic capacitance. The additional element can be any device that contributes an impedance, including capacitance and resistance, between the conductive traces and the substrate. The conductive traces can be metal lines or a polycrystaline silicon (poly) resistor device.

In one example, the substrate includes a PWELL and the element disposed between the substrate and the conductive trace is an electrically AC floating NWELL.

In another example, the substrate includes a PWELL and the element disposed between the substrate and the conductive trace comprises an electrically AC floating NWELL and PWELL. The second capacitance is produced between the electrically AC floating PWELL and the electrically AC floating NWELL, and a third capacitance is produced between the electrically AC floating NWELL and the substrate. The first, second and third capacitances are in series with each other.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate embodiments of the present invention and, together with the description, further serve to explain the principles of the invention and to enable a person skilled in the pertinent art to make and use the invention.

DETAILED DESCRIPTION OF THE INVENTION

Overview and Terminology

As will be described in more detail below, embodiments of the present invention reduce the parasitic capacitance between a conductive trace and a substrate in an integrated circuit device (e.g, a CMOS device), without changing the process material or flow. Terminology used to describe embodiments of the present invention is discussed below.

The term "NWELL" means a region of a substrate (e.g., a silicon wafer) that has a relatively high concentration of n-type dopants, so that negatively charged electrons are available for electrical conduction. Example n-type dopants can include, but are not limited to, antimony trioxide, arsenic trioxide, arsine, phosphorus oxychloride, phosphorus pentoxide, phosphine or other n-type dopants as would be apparent to one skilled in the relevant art(s).

The term "PWELL" means a region of a substrate (e.g., a silicon wafer) that has a relatively high concentration of p-type dopants, so that positive "holes" (or the absence of electrons) are available for electrical conduction. Example p-type dopants can include, but are not limited to, boron tribromide, boron trioxide, diborane, boron trichloride, boron nitride or other p-type dopants as would be apparent to one skilled in the relevant art(s).

As a person skilled in the relevant art(s) will appreciated, the combination of an NWELL and a PWELL are typically used in CMOS structures to form both n-channel and p-channel transistors. CMOS circuits are typically smaller and consume less power than comparable circuits.

The terms "signal line" and "conductive trace" are used interchangeably to mean an electrically conductive material that is separated from a substrate by an insulator layer, sometimes called a field oxide. Typically, a field oxide is a dielectric, like silicon dioxide ($SiO_2$), but other materials can be used as a field oxide, as is know by persons skilled in the relevant art(s). As mentioned above, examples of signal lines can include, but are not limited to, metal lines and/or polycrystaline silicon (poly) resistors.

EXAMPLE STRUCTURES

Figure 1:
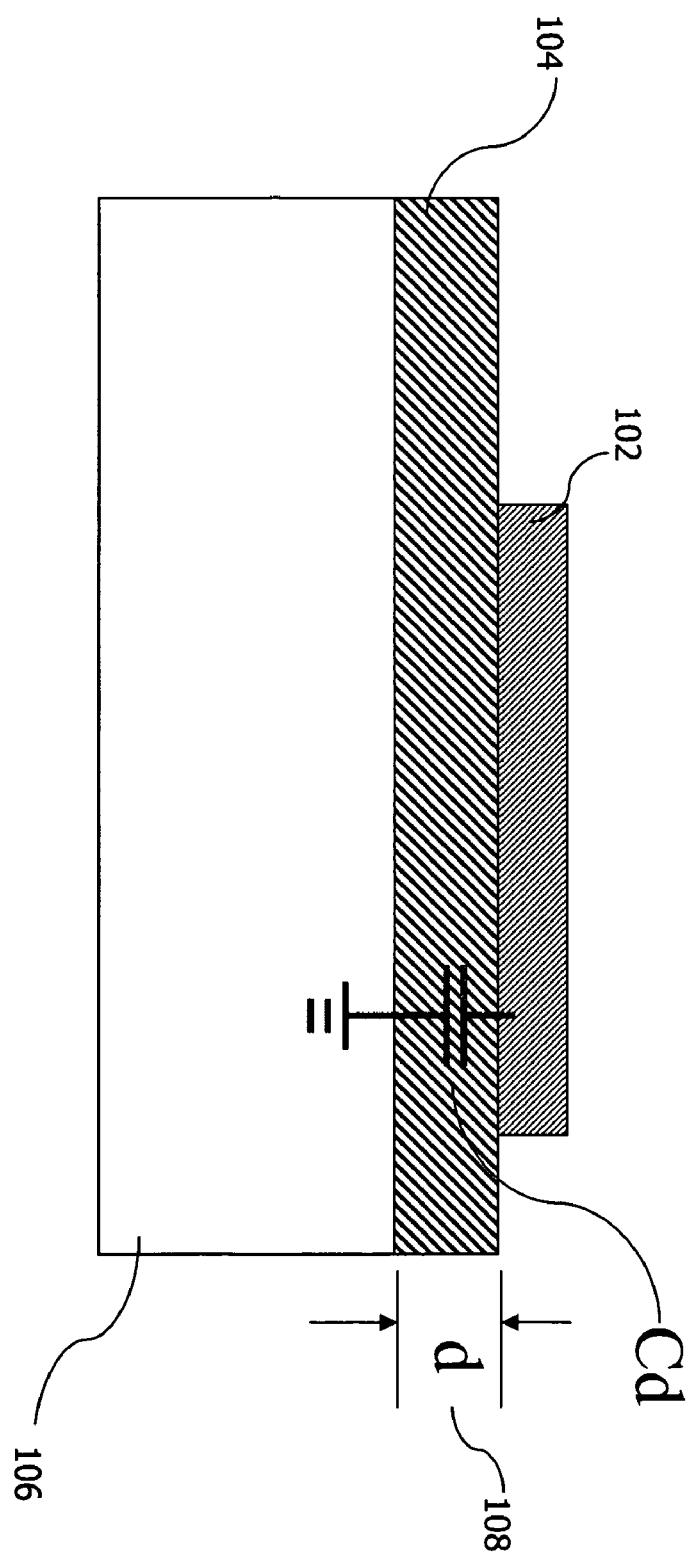
FIG. 1 is a cross sectional view of a conductive trace mounted on a substrate.

In VLSI applications, a parasitic capacitance arises from an electrical coupling between a conductive trace and a substrate that are separated by an insulator layer or field oxide. FIG. 1 is a cross sectional view of a conventional arrangement of a conductive trace 102 mounted on a substrate 106 (e.g, a silicon wafer). An insulator layer 104 is disposed between the conductive trace 102 and the substrate 106. Insulator layer 104 produces a separation 108 between the conductive trace 102 and the substrate 106. Insulator layer 104 can be composed of silicon dioxide or silicon nitride, or some other dielectric material as would be apparent to one skilled in the semiconductor art.

The arrangement in FIG. 1 results in a parasitic capacitance (Cd) between the conductive trace 102 and the substrate 106. This parasitic capacitance reduces the signal bandwidth and signal speed due to the filtering effect, as described above in connection with Eq. 1.

Figure 2:
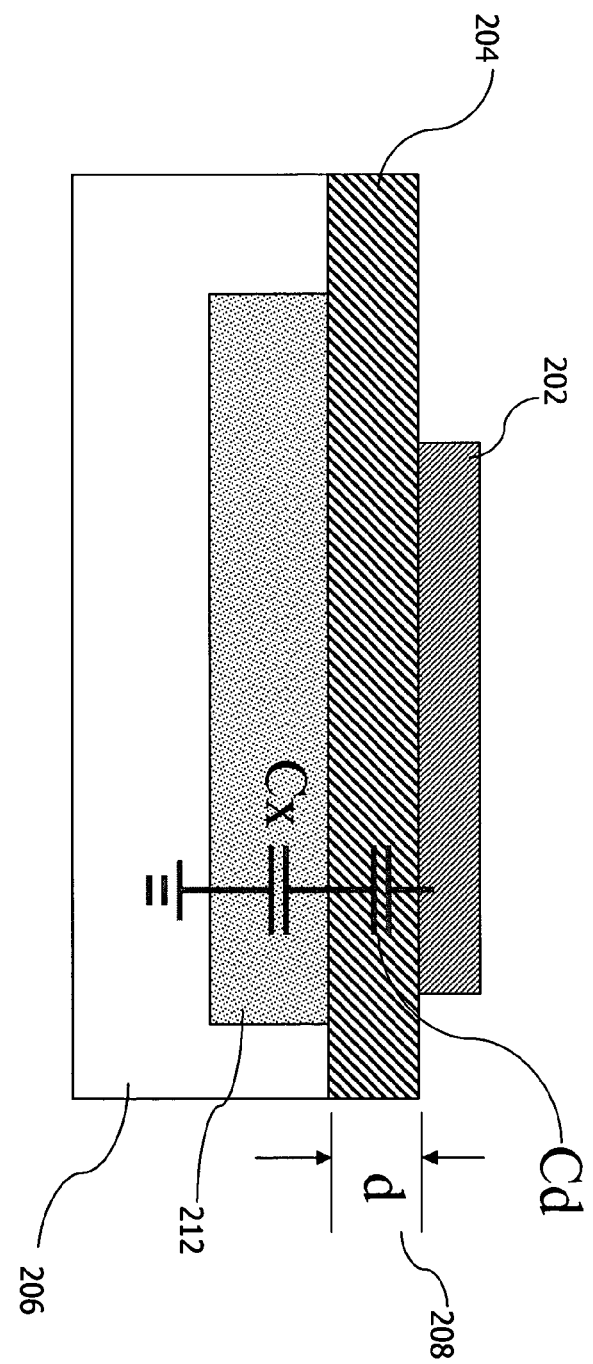
FIG. 2 is an embodiment of the invention in which an element is disposed between the conductive trace and the substrate.

According to an embodiment of the present invention, the parasitic capacitance between the conductive traces and the substrate is reduced by disposing an element between the conductive trace and the substrate. FIG. 2 is an embodiment of the invention in which an element 212 is disposed between the conductive trace 202 and the substrate 206. The element 212 produces an additional capacitance, in series with the parasitic capacitance, between the conductive trace 202 and the substrate 206. The series combination of the parasitic capacitance and the additional capacitance results in a reduced effective capacitance between the conductive trace 202 and the substrate 206, which is given by the following equation:

$$C_{eff} = \frac{C_x C_d}{C_x + C_d}, \quad \text{Eq. 2}$$

where $C_{eff}$ is the effective capacitance, $C_x$ is the additional capacitance, and $C_d$ is the capacitance across the insulator layer. From Eq. 2 it is seen that $C_{eff}$ is always less than $C_d$, which means the effective parasitic capacitance between the conductive trace 202 and the substrate 206 is less than the original parasitic capacitance.

Figure 3:
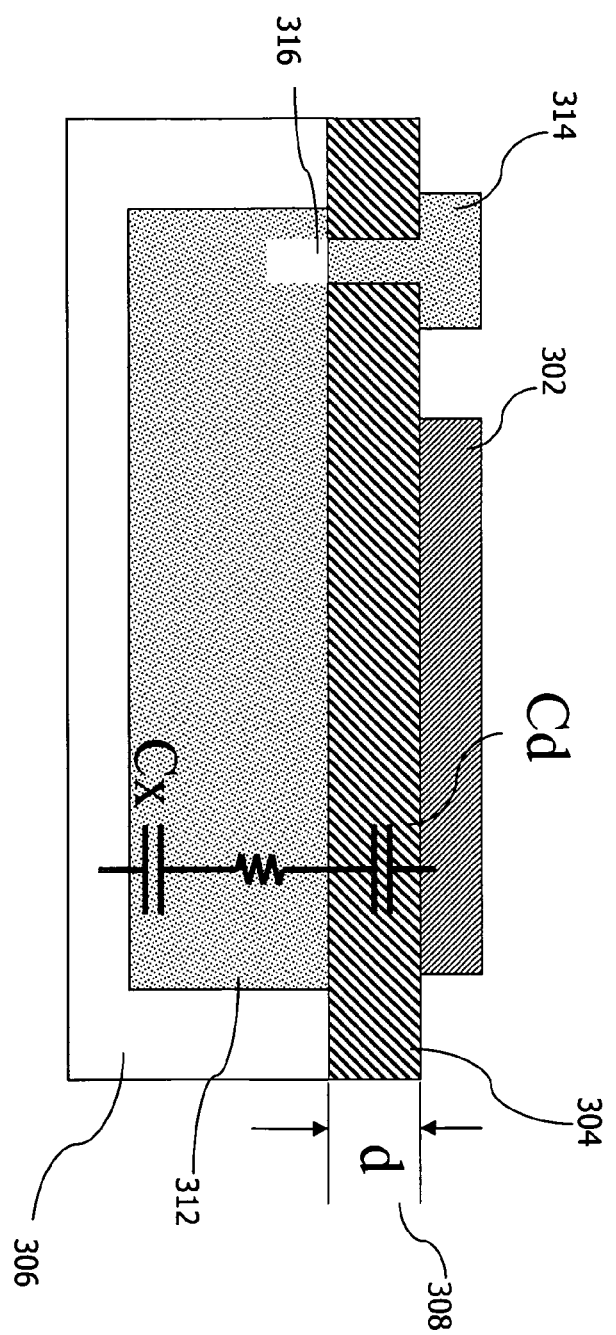
FIG. 3 is an example in which the element between the conductive trace and the substrate comprises an NWELL.
Figure 4:
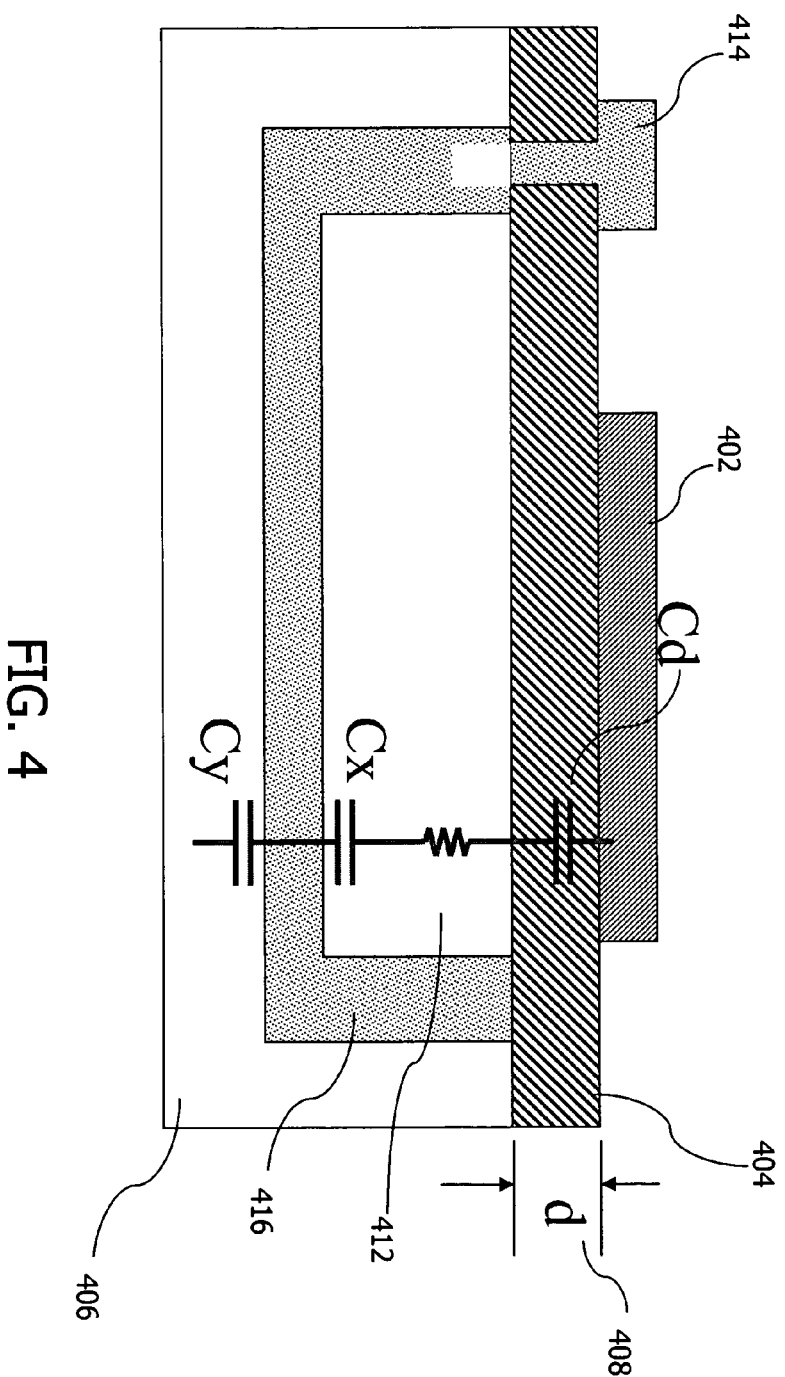
FIG. 4 is an example in which the element between the conductive trace and the substrate comprises a PWELL and a deep NWELL.

It will be apparent to a person skilled in the relevant art that the element inserted between the conductive trace and substrate can be any device that contributes an impedance, including capacitance and resistance, between the conductive trace and the substrate to result in an additional capacitance that is in series with the original capacitance between the conductive trace and the substrate. FIGS. 3 and 4 illustrate two example elements or combinations of elements that can be disposed between the signal lines and the substrate to reduce the parasitic capacitance.

FIG. 3 is an example in which the element that provides a capacitance in series with the parasitic capacitance is an NWELL 312. In this example, the substrate comprises a PWELL 306, i.e., a region of silicon wafer substrate containing p-type dopants.

In order to form a capacitance ($C_x$) between the NWELL 312 and the PWELL 306, the NWELL 312 must be electrically AC floating. In an embodiment, the NWELL 312 can be made electrically AC floating by coupling it to a diode 314, which is coupled to a high voltage source (not shown), so that the NWELL 312 is biased at a higher voltage than the PWELL (substrate) 306. In other words, NWELL 312 is in direct electrical contact with the p-type portion 316 of the PN junction of diode 314. The high voltage source coupled to diode 314 can be, for example, a supply voltage of the IC device of which the structure depicted in FIG. 3 is a part. Other techniques to bias NWELL 312 will become apparent to a person having ordinary skill in the pertinent art.

In standard CMOS technologies, the capacitance ($C_x$) between the PWELL 306 and the NWELL 312 is about the same as the original parasitic capacitance ($C_d$) between the conductive trace 302 and the PWELL 306. Therefore, according to Eq. 2, the effective parasitic capacitance ($C_{eff}$) is about half of the original parasitic capacitance ($C_d$) between the conductive trace 302 and the PWELL 306. This means that the parasitic capacitance between the conductive trace 302 and the PWELL 306 is reduced by 50%.

For the example of FIG. 3, if the conductive trace 302 is disposed on a polycrystaline layer and has a width of approximately 8 µm and a length of approximately 26 µm, then $C_d$ (the capacitance between conductive trace 302 and NWELL 312) is approximately 50 fF ($50 \times 10^{-15}$ Farads) and $C_x$ (the capacitance between NWELL 312 and PWELL 306) is approximately 47 fF. Therefore, according to Eq. 2, $C_{eff}$ (the effective capacitance between conductive trace 302 and PWELL 306) is approximately 24 fF, which represents a reduction in the typical capacitance between conductive trace 302 and PWELL 306 of approximately 51% or 26 fF. (Note: in the example quoted above, three series of diodes were used to avoid forward biasing if the signal swing is too large.)

To further reduce the parasitic capacitance between the conductive traces and the substrate, a second element can be disposed between the conductive traces and the substrate, thereby forming an additional capacitance in series with the parasitic capacitance. For instance, FIG. 4 is an example in which the element between the conductive trace 402 and the substrate 406 comprises a PWELL 412 and a deep NWELL 416. Again, the PWELL 412 and the deep NWELL 416 are kept electrically AC floating and DC reversed biased by coupling the deep NWELL 416 to a voltage source (not shown) through a reverse-biased diode 414, in like manner to that described above with reference to FIG. 3. This arrangement results in a floating capacitance, $C_x$, between the PWELL 412 and the deep NWELL 416, and a floating capacitance, $C_y$, between the deep NWELL 416 and the substrate 406. Therefore, the effective parasitic capacitance between the conductive trace 402 and the substrate 406 is reduced according to the following equation:

$$C_{\textit{eff}} = \frac{C_x C_y C_d}{C_x C_y + C_y C_d + C_d C_x}. \qquad \text{Eq. 3}$$

EXAMPLE METHOD

As a person skilled in the relevant art(s) will appreciate, the structures in FIGS. 3 and 4 can be fabricated according to several different processing steps. An example fabrication process for the structure illustrated in FIG. 3 is described below with reference to FIGS. 5A–5E. It is to be appreciated that the fabrication process is presented by way of example only, and not limitation. Other fabrication processes can be employed to fabricate either of the structures illustrated in FIG. 3 or 4 without deviating from the scope and spirit of the present invention.

Figure 5A:
FIGS. 5A–5E illustrate an exemplary process for making the structure depicted in FIG. 3.
Figure 5B:
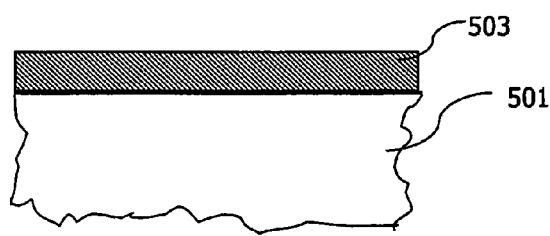

Step 1: Layering Operation. The example fabrication process begins with a portion of a substrate that is doped with p-type dopants to form a PWELL 501, as shown in FIG. 5A. The doping can be achieved through thermal diffusion, ion implantation, or some other doping technique as would become apparent to those skilled in the relevant art(s). PWELL 501 is then layer with a field oxide layer 503 (e.g., silicon dioxide), as shown in FIG. 5B. Example layering techniques can include physical vapor deposition (PVD), chemical vapor deposition (CVD), evaporation, sputtering, or some other technique as would be apparent to one skilled in the relevant art(s).

Figure 5C:
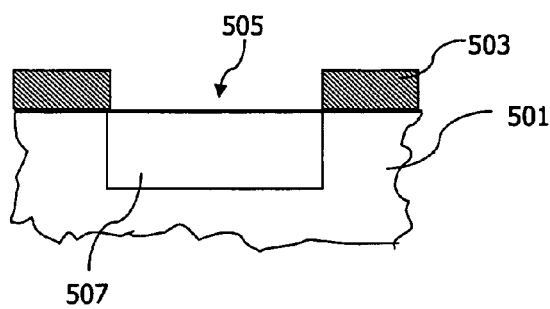

Step 2: Patterning Operation. The patterning operation leaves an opening 505 in field oxide layer 503 exposing substrate 501, as shown in FIG. 5C. Substrate 501 is then doped with an n-type dopant to produce an NWELL 507. Lithography and deposition are well known techniques for these steps, as would be apparent to a person skilled in the relevant art.

Figure 5D:
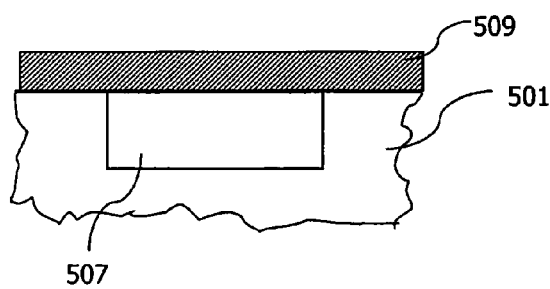

Step 3: Layering Operation. Field oxide layer 503 is then removed by known techniques and a new field oxide layer 509 is disposed on substrate 501, as indicated in FIG. 5D.

Step 4: Etching Operation. A hole is etched in field oxide layer 509 using known techniques to expose NWELL 507.

Figure 5E:
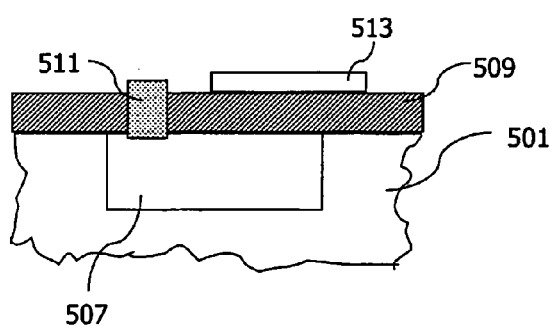

Step 5: Layering/Patterning Operation. A diode 511 is patterned and formed using well-known techniques having its PN junction reversed biased, as shown in FIG. 5E.

Step 6: Layering/Patterning Operation. A conductive trace 513 is created using known layering/patterning techniques, as would be apparent to one skilled in the relevant art(s), as shown in FIG. 5E.

In addition to the steps outlined above, various heat treatments may be employed to cure, alloy, and/or repair (i.e., anneal) the structure, as would be apparent to one skilled in the relevant art(s). As is well-known in the relevant art(s), heat treatments are operations in which a substrate (e.g., wafer) is heated and cooled to achieve specific results. For example, ion implantation disrupts the crystal structure of a wafer; a heat treatment can be used to repair (or anneal) the crystal structure of the wafer after ion implantation.

CONCLUSION

An arrangement for reducing the parasitic capacitance between a conductive trace and a substrate has been disclosed. While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the hereinabove described exemplary embodiments, but should be defined only in accordance with the following claims and their equivalents.

What is claimed is:

1. A semiconductor device, comprising:
  a substrate;
  an insulator layer disposed upon the substrate;
  a conductive trace disposed upon the insulator layer, wherein a first capacitance exists between the conductive trace and the substrate;
  an element disposed within a surface portion of the substrate; and
  a biasing device that DC biases the element to a voltage different than a voltage of the substrate;
  wherein DC biasing the element results in a second capacitance between the conductive trace and the substrate, such that the second capacitance is produced in series with the first capacitance and reduces an effective capacitance between the conductive trace and the substrate.

2. The semiconductor device of claim 1, wherein the insulator layer is a field oxide.

3. The semiconductor device of claim 1, wherein the effective capacitance between the conductive trace and the substrate is reduced by at least 50 percent.

4. The semiconductor device of claim 1, wherein:
  the substrate comprises a PWELL; and
  the element disposed within the surface portion of the substrate comprises an electrically AC floating NWELL.

5. The semiconductor device of claim 1, wherein:
  the substrate comprises a PWELL; and
  the element disposed within the surface portion of the substrate comprises an electrically AC floating NWELL and an electrically AC floating PWELL, such that the second capacitance is produced between the electrically AC floating PWELL and the electrically AC floating NWELL and a third capacitance is produced between the electrically AC floating NWELL and the substrate, wherein the first, second and third capacitances are in series with each other.

6. A method for reducing an effective capacitance in a semiconductor device, comprising:
  (a) providing a substrate;
  (b) forming an insulator layer upon the substrate;
  (c) forming a conductive trace upon the insulator layer, wherein a first capacitance exists between the conductive trace and the substrate;
  (d) forming an element within a surface portion of the substrate; and
  (e) DC biasing the element to a voltage different than a voltage of the substrate resulting in a second capacitance between the conductive trace and the substrate, the second capacitance being in series with the first capacitance and reducing an effective capacitance between the conductive trace and the substrate.

7. The method of claim 6, wherein step (b) comprises: using a field oxide as the insulator layer.

8. The method of claim 6, wherein step (e) comprises: reducing the effective capacitance by at least 50 percent.

9. The method of claim 6, wherein the substrate comprises a PWELL and steps (d) and (e) comprise:
using an electrically AC floating NWELL as the element formed within the surface portion of the substrate.

10. The method of claim 6, wherein the substrate comprises a PWELL and steps (d) and (e) comprise:
using an electrically AC floating NWELL and an electrically AC floating PWELL as the element formed within the surface portion of the substrate, the second capacitance being produced between the electrically AC floating PWELL and the electrically AC floating NWELL and a third capacitance being produced between the electrically AC floating NWELL and the substrate, thereby producing the first, second and third capacitances in series with each other.

* * * * *